(12) United States Patent
Masui et al.

(10) Patent No.: US 8,290,009 B2
(45) Date of Patent: Oct. 16, 2012

(54) VERTICAL CAVITY SURFACE EMITTING LASER

(75) Inventors: Yuji Masui, Kanagawa (JP); Takahiro Arakida, Kanagawa (JP); Rintaro Koda, Tokyo (JP); Osamu Maeda, Kanagawa (JP); Tomoyuki Oki, Miyagi (JP); Naoki Jogan, Kanagawa (JP)

(73) Assignee: Sony Corporation, Tokyo (JP)

( * ) Notice: Subject to any disclaimer, the term of this patent is extended or adjusted under 35 U.S.C. 154(b) by 318 days.

(21) Appl. No.: 12/458,962

(22) Filed: Jul. 28, 2009

(65) Prior Publication Data
US 2010/0046565 A1 Feb. 25, 2010

(30) Foreign Application Priority Data
Aug. 25, 2008 (JP) ................... 2008-215775

(51) Int. Cl.
*H01S 5/00* (2006.01)
(52) U.S. Cl. .............. 372/45.01; 372/46.01; 372/50.124
(58) Field of Classification Search ............... 372/45.01, 372/46.01, 50.124
See application file for complete search history.

(56) References Cited

U.S. PATENT DOCUMENTS

| | | | |
|---|---|---|---|
| 6,529,541 B1 | 3/2003 | Ueki et al. | |
| 2002/0031154 A1 | 3/2002 | Yokouchi et al. | |
| 2004/0184500 A1 | 9/2004 | Kuwata | |
| 2006/0007979 A1* | 1/2006 | Jikutani et al. | 372/92 |
| 2007/0014324 A1* | 1/2007 | Maeda et al. | 372/46.01 |
| 2007/0120133 A1* | 5/2007 | Koda et al. | 257/80 |
| 2008/0240194 A1* | 10/2008 | Maeda et al. | 372/50.1 |
| 2008/0304532 A1* | 12/2008 | Uchida | 372/50.124 |
| 2009/0001386 A1* | 1/2009 | Koda et al. | 257/79 |
| 2009/0161713 A1* | 6/2009 | Duggan et al. | 372/45.01 |

FOREIGN PATENT DOCUMENTS

| | | |
|---|---|---|
| JP | 04-275485 A | 10/1992 |
| JP | 11-121867 A | 4/1999 |
| JP | 2001-135890 A | 5/2001 |
| JP | 2001-210908 | 8/2001 |
| JP | 2001-284722 A | 10/2001 |
| JP | 2002-208755 | 7/2002 |
| JP | 2002-353562 A | 12/2002 |

(Continued)

OTHER PUBLICATIONS

Japanese Office Action issued Jun. 1, 2010 for corresponding Japanese Application No. 2008-215775.

*Primary Examiner* — Yuanda Zhang
(74) *Attorney, Agent, or Firm* — Rader Fishman & Grauer, PLLC (57) ABSTRACT

A vertical cavity surface emitting laser includes a layer-stack structure including, on a substrate, a transverse-mode adjustment layer, a first multilayer reflecting mirror, an active layer having a light emission region, and a second multilayer reflecting mirror in order from the substrate side, and including a current confinement layer in which a current injection region is formed in a region corresponding to the light emission region in the first multilayer reflecting mirror, between the first multilayer reflecting mirror and the active layer, between the active layer and the second multilayer reflecting mirror, or in the second multilayer reflecting mirror. In the transverse-mode adjustment layer, reflectance at an oscillation wavelength in the region opposite to a center of the light emission region is higher than that at an oscillation wavelength in the region opposite to an outer edge of the light emission region.

10 Claims, 7 Drawing Sheets

FOREIGN PATENT DOCUMENTS

| | | |
|---|---|---|
| JP | 2003-115634 A | 4/2003 |
| JP | 2003-332683 A | 11/2003 |
| JP | 2004-288674 | 10/2004 |
| JP | 2004-356271 A | 12/2004 |
| JP | 2005-012000 A | 1/2005 |
| JP | 2006-156947 A | 6/2006 |
| JP | 2006-210429 A | 8/2006 |
| JP | 2007-201398 A | 8/2007 |
| JP | 2008-016824 A | 1/2008 |
| JP | 2008-147620 A | 6/2008 |
| WO | WO-2005/074080 A1 | 8/2005 |

* cited by examiner

VERTICAL CAVITY SURFACE EMITTING LASER

BACKGROUND OF THE INVENTION

1. Field of the Invention

The present invention relates to a vertical cavity surface emitting laser (VCSEL) emitting a laser beam from its top face and, more particularly, to a VCSEL suitably applicable to a use necessitating a beam profile of a perfect circle shape.

2. Description of the Related Art

A VCSEL emits light in a direction orthogonal to a substrate different from an end-face emitting type of related art. Since a number of elements may be arranged on the same substrate in a two-dimensional array shape, in recent years, the VCSEL is noted as a light source for a digital copy machine or a printer machine.

In the past, in a laser diode of this kind, a pair of multilayer reflecting mirrors is formed on a substrate, and an active layer as a light emitting region is provided between the pair of multilayer reflecting mirrors. For one of the multilayer reflecting mirrors, to increase the current injection efficiency to the active layer and decrease a threshold current, a current confinement layer having a structure in which a current injection region is narrowed is provided. A lower electrode is provided on the under face side, and an upper electrode is provided on the top face side. A light emission port for emitting a laser beam is provided in the upper electrode. In the laser diode, current is confined by the current confinement layer, and the confined current is injected to the active layer where light is generated. The light is repeatedly reflected by the pair of multilayer reflecting mirrors, and a resultant light is emitted as a laser beam from the light emission port in the upper electrode.

In the VCSEL, symmetric property in a structure in a plane (stack-layer plane) perpendicular to a direction of emitting a laser beam (stack-layer direction) is excellent, so that a beam shape close to a perfect circle may be obtained. It is known that fundamental transverse mode oscillation mainly occurs in a center region in the laser beam emission region and, on the other hand, mainly high-order transverse mode oscillation occurs in an outer edge region. Consequently, when the current injection region in the current confinement layer is made too wide or when the injection current amount is set too large for higher output, a laser beam in the high-order transverse mode is also output with high output power, and there is a disadvantage that a beam shape close to a perfect circle may not be obtained.

To solve such a disadvantage, a number of methods for creating a gain difference between a fundamental transverse mode and a high-order transverse mode have been proposed. For example, Japanese Unexamined Patent Application Publication Nos. 2001-210908 and 2004-288674 disclose a method of increasing a gain in the fundamental transverse mode by adjusting each of a current confinement diameter and the diameter of the light emission port in the upper electrode. For example, another literature discloses a method of forming a stack-layer structure of a semiconductor or an insulator in a center region in a laser beam emission region to increase reflectance, thereby increasing the gain in the fundamental transverse mode.

SUMMARY OF THE INVENTION

In those methods, however, a difference is provided in reflectance or loss on the light emission side, so that it is difficult to realize both high gain and high output. For example, when the reflectance is made high in a certain mode, the gain increases in the mode, and a laser oscillates easily. However, a light output in the mode decreases.

It is therefore desirable to provide a VCSEL capable of emitting a laser beam in a fundamental transverse mode with high output power while suppressing oscillation in a high-order transverse mode.

According to an embodiment of the present invention, there is provided a VCSEL including a layer-stack structure including, on a substrate, a transverse-mode adjustment layer, a first multilayer reflecting mirror, an active layer having a light emission region, and a second multilayer reflecting mirror in order from the substrate side. The layer-stack structure has a current confinement layer in which a current injection region is formed in a region corresponding to the light emission region in the first multilayer reflecting mirror, between the first multilayer reflecting mirror and the active layer, between the active layer and the second multilayer reflecting mirror, or in the second multilayer reflecting mirror. In the transverse-mode adjustment layer, reflectance at an oscillation wavelength in the region opposite to a center of the light emission region is higher than that at an oscillation wavelength in the region opposite to an outer edge of the light emission region.

In the VCSEL of an embodiment of the present invention, in the transverse mode adjustment layer, reflectance at the oscillation wavelength in the region opposite to the center in the light emission region is higher than that at the oscillation wavelength in the region opposite to the outer edge of the light emission region. The region opposite to the center of the light emission region mainly corresponds to a region in which the fundamental transverse mode oscillation occurs. The region opposite to the outer edge of the light emission region mainly corresponds to a region in which the high-order transverse mode oscillation occurs. With the configuration, the gain increases in the fundamental transverse mode and a laser easily oscillates. On the other hand, the decrease in the gain and oscillation of a laser is suppressed in the high-order transverse mode. The transverse-mode adjustment layer is provided on the substrate side, that is, on the side opposite to the light emission side. With the configuration, there is no possibility that a light output in the fundamental transverse mode is disturbed by the transverse mode adjustment layer, so that the slope efficiency in the fundamental transverse mode may be made high. As a result, for example, even in the case where the injection current amount is increased or temperature rises, the high-order transverse mode is hardly included in the light output of the laser diode.

In the VCSEL of an embodiment of the present invention, the transverse mode adjustment layer is provided on the substrate side, that is, on the side opposite to the light emission side, and reflectance at the oscillation wavelength $\lambda$ in the region opposite to the center in the light emission region is set to be higher than that at the oscillation wavelength in the region opposite to the outer edge of the light emission region. Consequently, while suppressing oscillation in the high-order transverse mode, a beam in the fundamental transverse mode may be emitted with a high output power.

Other and further objects, features and advantages of the invention will appear more fully from the following description.

DETAILED DESCRIPTION OF THE PREFERRED EMBODIMENTS

Embodiments of the present invention will be described in detail hereinbelow with reference to the drawings.

Figure 1:
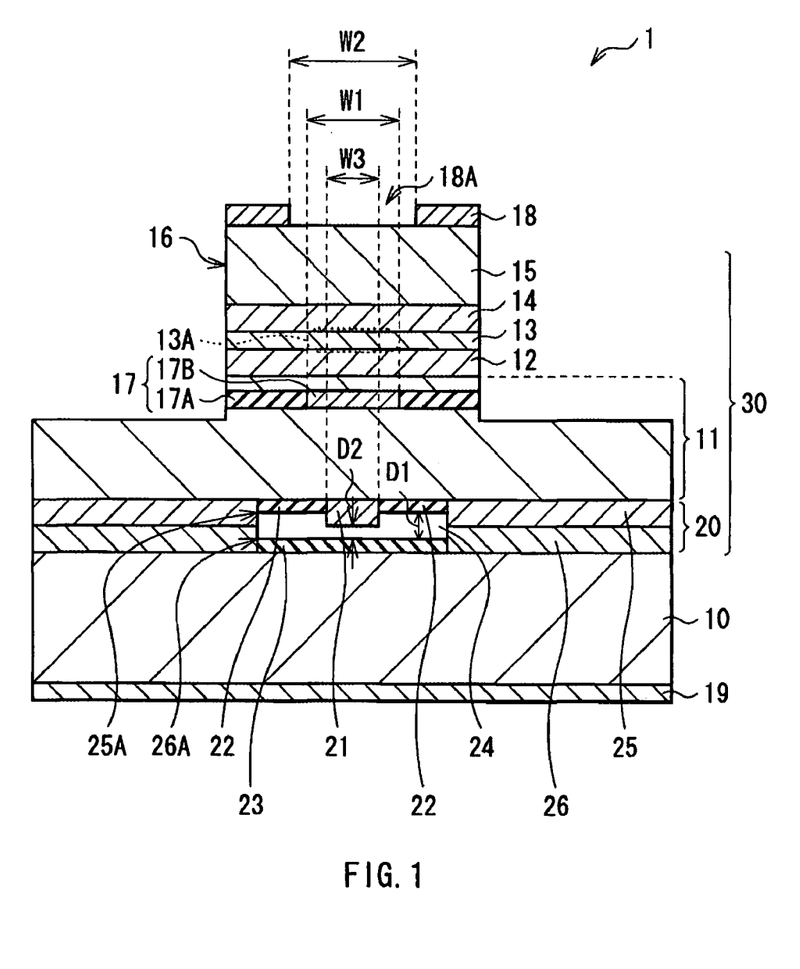
FIG. 1 is a cross section of a laser diode as an embodiment of the present invention.

FIG. 1 illustrates a sectional configuration of a laser diode 1 of a surface-emitting type according to an embodiment of the present invention. FIG. 1 schematically illustrates the configuration which is different from actual dimensions and shapes. The laser diode 1 has a stack-layer structure 30 obtained by stacking a transverse-mode adjustment layer 20, a lower DBR layer 11 (first multilayer reflecting mirror), a lower spacer layer 12, an active layer 13, an upper spacer layer 14, and an upper DBR layer 15 (second multilayer reflecting mirror) in this order on one surface of a substrate 10. In an upper part of the stack-layer structure 30, concretely, a part of the lower DBR layer 11, the lower spacer layer 12, the active layer 13, the upper spacer layer 14, and the upper DBR layer 15 serve as a circular-cylindrical mesa part 16, for example, having a width of about 20 μm. The laser diode 1 also has a current confinement layer 17 in the mesa part 16, for example, in the lower DBR layer 11, between the lower DBR layer 11 and the lower spacer layer 12, between the upper spacer layer 14 and the upper DBR layer 15, or in the upper DBR layer 15. FIG. 1 illustrates the case where the current confinement layer 17 is provided in the lower DBR layer 11.

The substrate 10 supports the stack-layer structure 30 and is different from a substrate used for crystal growth of the lower DBR layer 11 or the like. The substrate 10 is preferably made of a material which absorbs light emitted from the active layer. For example, in the case where the wavelength of light emitted from the active layer is 780 nm or 850 nm, the substrate 10 may be a GaAs substrate which absorbs light of the band of the wavelengths. For example, in the case where the wavelength of light emitted from the active layer is 980 nm, the substrate 10 may be a Si substrate which absorbs light having the wavelength band. In the case where current injection from the back face of the substrate 10 is necessary, preferably, the substrate 10 has n-type or p-type conductive property.

The lower DBR layer 11 is formed by, for example, alternately stacking a low-refractive-index layer (not illustrated) and a high-refractive-index layer (not illustrated). The number of pairs of the low-refractive-index layer and the high-refractive-index layer in the lower DBR layer 11 is almost equal to, for example, that of the low-refractive-index layer and the high-refractive-index layer in the upper DBR layer 15. The low-refractive-index layer is made of, for example, p-type $Al_{x1}Ga_{1-x1}As$ (0<x1<1) having an optical thickness of λ/4 (λ denotes oscillation wavelength). The high-refractive-index layer is made of, for example, p-type $Al_{x2}Ga_{1-x2}As$ (0<x2<x1) having an optical thickness of λ/4. Examples of the p-type impurity are zinc (Zn), magnesium (Mg), beryllium (Be), and the like.

The lower spacer layer 12 is made of, for example, $Al_{x3}Ga_{1-x3}As$ (0<x3<1). The active layer 13 is made of, for example, a GaAs-based material. In the active layer 13, a region opposite to a current injection region 17B which will be described later is a light emission region 13A. The center of the light emission region 13A mainly corresponds to a region in which fundamental transverse mode oscillation mainly occurs. The outer edge of the light emission region 13A, that is, the region surrounding the center in the light emission region 13A corresponds to a region in which higher transverse mode oscillation mainly occurs. The upper spacer layer 14 is made of, for example, $Al_{x4}Ga_{1-x4}As$ (0<x4<1). Although the lower spacer layer 12, the active layer 13, and the upper spacer layer 14, preferably, do not contain impurity, they may contain p-type or n-type impurity. Examples of the n-type impurity are silicon (Si) and selenium (Se).

The upper DBR layer 15 is formed by, for example, alternately stacking a low-refractive-index layer (not illustrated) and a high-refractive-index layer (not illustrated). The low-refractive-index layer is made of, for example, n-type $Al_{x5}Ga_{1-x5}As$ (0<x5<1) having an optical thickness of λ/4 (λ denotes oscillation wavelength). The high-refractive-index layer is made of, for example, n-type $Al_{x6}Ga_{1-x6}As$ (0<x6<x5) having an optical thickness of λ/4.

In the current confinement layer 17, a region from a side face of the mesa part 16 to a predetermined depth serves as a current confinement region 17A, and the other region (a center region in the mesa part 16) serves as the current injection region 17B. A width (diameter) W1 of the current injection region 17B is, for example, about 10 μm and, preferably, narrower than a width (diameter) W2 of an aperture 18A in an upper electrode 18. The current injection region 17B is made of, for example, p-type $Al_{x8}Ga_{1-x8}As$ (0<x8≦1). The current confinement region 17A is made of, for example, materials containing $Al_2O_3$ (aluminum oxide) and is formed by oxidizing Al of high density included in a layer 17D to be oxidized from the side face as will be described later. Therefore, the current confinement layer 17 has the function of confining current. In the case where the current confinement layer 17 is provided in the lower DBR layer 11 as illustrated in FIG. 1, the current confinement layer 17 is provided in the portion of the low-refractive-index layer apart from the active layer 13 side only by a predetermined distance in place of the low-refractive-index layer.

On the top face of the mesa part 16 (the top face of the upper DBR layer 15), the annular upper electrode 18 having the aperture (light emission port) 18A in the region including the region opposite to the current injection region 17B is formed. A protection film (not illustrated) is formed on side surface of the mesa part 16 and the peripheral surfaces of the mesa part 16. A lower electrode 19 is provided on the rear face of the substrate 10.

The upper electrode 18 is formed by sequentially stacking, for example, an alloy of gold (Au) and germanium (Ge), nickel (Ni), and gold (Au) in this order, and is electrically connected to the top face of the mesa part 16. The lower electrode 19 has a structure obtained by sequentially stacking, for example, an alloy of Au and Ge, Ni, and Au in order from the substrate 10 side, and is electrically connected to the substrate 10. The protection film is made of an insulating material such as oxide or nitride.

In the embodiment, as described above, the transverse-mode adjustment layer 20 is provided on the substrate 10 side, that is, on the side opposite to the light emission side. The transverse-mode adjustment layer 20 has, in a region opposite to the mesa part 16, a high-reflectance layer 21, low-reflectance layers 22 and 23, and a gap 24 and also has, in the same plane of those layers and around those layers, metal layers 25 and 26.

The high-reflectance layer 21 has, for example, a circular disc shape and is provided in a region opposite to the center of the light emission region 13A and in contact with the surface on the transverse-mode adjustment layer 20 side of the lower DBR layer 11. Width (diameter) W3 of the high-reflectance layer 21 is narrower than width (diameter) W1 of the current injection region 17B. The high-reflectance layer 21 is formed by stacking high-reflectance materials, for example, titanium (Ti), platinum (Pt), and gold (Au) in this order. The high-reflectance layer 21 may be made of materials other than the metals. The reflectance at an oscillation wavelength $\lambda$, of the high-reflectance layer 21 is, for example, 90% or higher and is extremely higher than that at the oscillation wavelength of a region opposite to the outer edge of the light emission region 13A in the transverse-mode adjustment layer 20. With the configuration, even in the case where reflection in the fundamental transverse mode is insufficient in the lower DBR layer 11, the insufficient amount may be compensated by the high-reflectance layer 21.

The low-reflectance layer 22 has, for example, an annular shape and is provided in a region opposite to the outer edge of the light emission region 13A and in contact with the surface on the transverse-mode adjustment layer 20 side of the lower DBR layer 11. The low-reflectance layer 22 is made of a low-reflectance member. The low-reflectance member includes, for example, a member whose refractive index is larger than 1 (air) and smaller than the refractive index (for example, about 3.5) of the surface on the transverse-mode adjustment layer 20 side in the lower DBR layer 11, for example, a light transmissive material such as SiN (refractive index=2.0). The optical film thickness of the low-reflectance layer 22 is preferably $(2k-1) \times \lambda/4$ (k denotes a positive number). With the configuration, the phase of light reflected by the interface between the low-reflectance layer 22 and the gap 24 in the light having the wavelength $\lambda$ entering from the active layer 13 side is shifted from the phase of light reflected by the interface between the lower DBR layer 11 and the low-reflectance layer 22 in the light having the wavelength $\lambda$ entering from the active layer 13 side by 180 degrees. As a result, the reflectance in the low-reflectance layer 22 may be substantially set to zero percent. That is, in this case, the low-reflectance layer 22 functions as a non-reflecting layer.

The low-reflectance layer 23 has, for example, an annular shape or a circular disc shape and is provided in contact with the surface on the transverse-mode adjustment layer 20 side of the substrate 10. The low-reflectance layer 23 is formed at least in a region opposite to the outer edge of the light emission region 13A and, preferably, is formed in a region opposite to the high-reflectance layer 21 and the low-reflectance layer 22. The low-reflectance layer 23 is made of a low-reflectance member similar to that of the low-reflectance layer 22. The low-reflectance member includes, for example, a member whose refractive index is larger than 1 (air) and smaller than the refractive index (for example, about 3.5) of the substrate 10 or the refractive index (for example, about 3.5) of the surface on the transverse-mode adjustment layer 20 side in the lower DBR layer 11, for example, a light transmissive material such as SiN (refractive index=2.0). The optical film thickness of the low-reflectance layer 23 is preferably $(2m-1) \times \lambda/4$ (m denotes a positive number). With the configuration, the phase of light reflected by the interface between the low-reflectance layer 23 and the substrate 10 in the light having the wavelength $\lambda$ entering from the active layer 13 side is shifted from the phase of light reflected by the interface between the gap 24 and the low-reflectance layer 23 in the light having the wavelength $\lambda$ entering from the active layer 13 side by 180 degrees. As a result, the reflectance in the low-reflectance layer 23 may be substantially set to zero percent. That is, in this case, the low-reflectance layer 23 functions as a non-reflecting layer.

In the transverse-mode adjustment layer 20, between the high-reflectance layer 21 and the low-reflectance layer 22 and the low-reflectance layer 23, that is, at least in a region opposite to the light emission region 13A, the gap 24 is provided. The high-reflectance layer 21 and the low-reflectance layer 22 are not in contact with the low-reflectance layer 23. In the case where the low-reflectance layers 22 and 23 function as the non-reflecting layer, fluctuations in the distance D1 between the low-reflectance layers 22 and 23 in the gap 24 do not exert an influence on light passing through the low-reflectance layer 22, the gap 24, and the low-reflectance layer 23. That is, in each laser diode 1, even in the case where the distance D1 varies according to the thickness of the metal layers 25 and 26 and the thickness of the low-reflectance layers 22 and 23, variations in the optical characteristic of light having the wavelength $\lambda$ do not occur in the region opposite the outer edge of the light emission region 13A in the transverse-mode adjustment layer 20. In the case where the low-reflectance layer 23 is provided also in the region opposite to the high-reflectance layer 21, in each laser diode 1, fluctuations in the distance D2 between the high-reflectance layer 21 and the low-reflectance layer 23 in the gap 24 do not exert an influence on light passing through the high-reflectance layer 21, the gap 24, and the low-reflectance layer 23. That is, in each laser diode 1, even in the case where the distance D2 varies according to the thickness of the metal layers 25 and 26 and the thickness of the low-reflectance layers 22 and 23, variations in the optical characteristic of light having the wavelength $\lambda$ do not occur in the region opposite to the center of the light emission region 13A in the transverse-mode adjustment layer 20.

The metal layers 25 and 26 have apertures 25A and 26A in a region opposite to the mesa part 16. Each of the apertures 25A and 26A has, for example, a circular disc shape. In the apertures 25A and 26A, the high-reflectance layer 21, the low-reflectance layers 22 and 23, and the gap 24 are provided. The metal layer 25 is made of, for example, metals obtained by stacking Ti, Pt, and Au from the lower DBR layer 11 side in this order. On the other hand, the metal layer 26 is made of, for example, metals obtained by stacking an alloy of Au and Ge, Ni, and Au from the substrate 10 side in this order. The metal layers 25 and 26 are adhered to each other in the manufacturing process as will be described later.

For example, the laser diode 1 of the embodiment may be manufactured as follows.

FIGS. 2A and 2B to FIGS. 4A and 4B illustrate the manufacturing method in order of processes. FIGS. 2A and 2B to FIGS. 4A and 4B illustrate sectional configurations of a device in the manufacturing process.

In this case, a compound semiconductor layer on an n-type GaAs substrate is formed by, for example, MOCVD (Metal Organic Chemical Vapor Deposition). As a material of a III-V-group compound semiconductor, for example, trimethyl aluminum (TMA), trimethyl gallium (TMG), trimethyl indium (TMIn), or arsine (AsH3) is used. As a material of a donor impurity, for example, $H_2Se$ is used. As a material of an acceptor impurity, for example, dimethyl zinc (DMZ) is used.

Figure 2A:
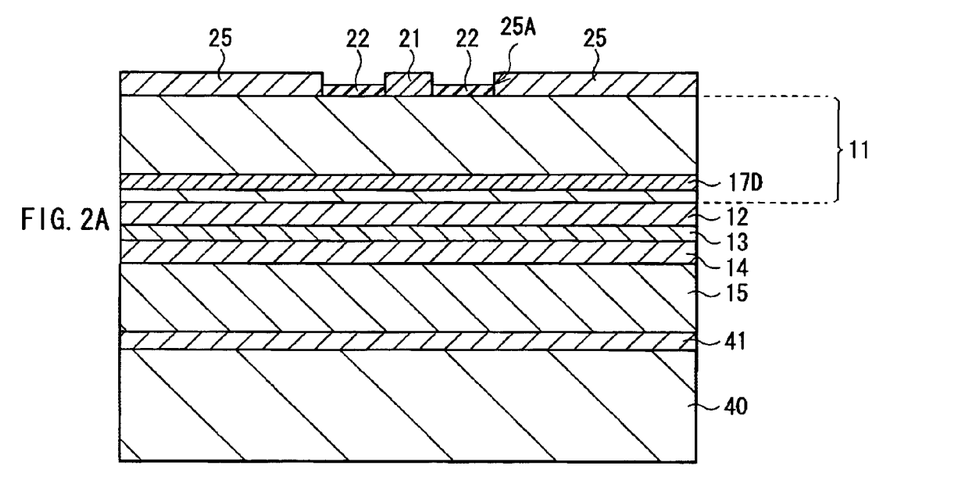
FIGS. 2A and 2B are cross sections for explaining a process of manufacturing the laser diode of FIG. 1.
Figure 2B:
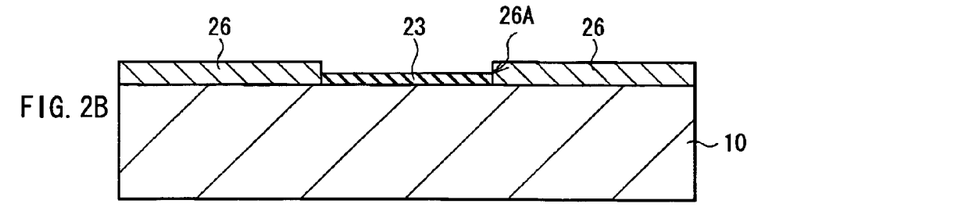

First, for example, on a substrate 40 made of n-type GaAs, an etching stop layer 41 made of, for example, GaInP, the upper DBR layer 15, the upper spacer layer 14, the active layer 13, the lower spacer layer 12, and the lower DBR layer 11 including a layer 17D to be oxidized made of, for example, AlAs are stacked in this order (refer to FIG. 2A). Next, on the surface of the lower DBR layer 11, for example, the metal layer 25 having the aperture 25A is formed, and the high-reflectance layer 21 is formed in the aperture 25A (refer to FIG. 2A). In the case where the metal layer 25 and the high-reflectance layer 21 are made of the same material and have the same thickness, they may be formed simultaneously. Subsequently, in a region where the metal layer 25 is not formed in the aperture 25A (the exposure face of the lower DBR layer 11), the low-reflectance layer 22 is formed. On the surface of the substrate 10, for example, the metal layer 26 having the aperture 26A is formed, and the low-reflectance layer 23 is formed in the aperture 26A (refer to FIG. 2B).

Figure 3A:
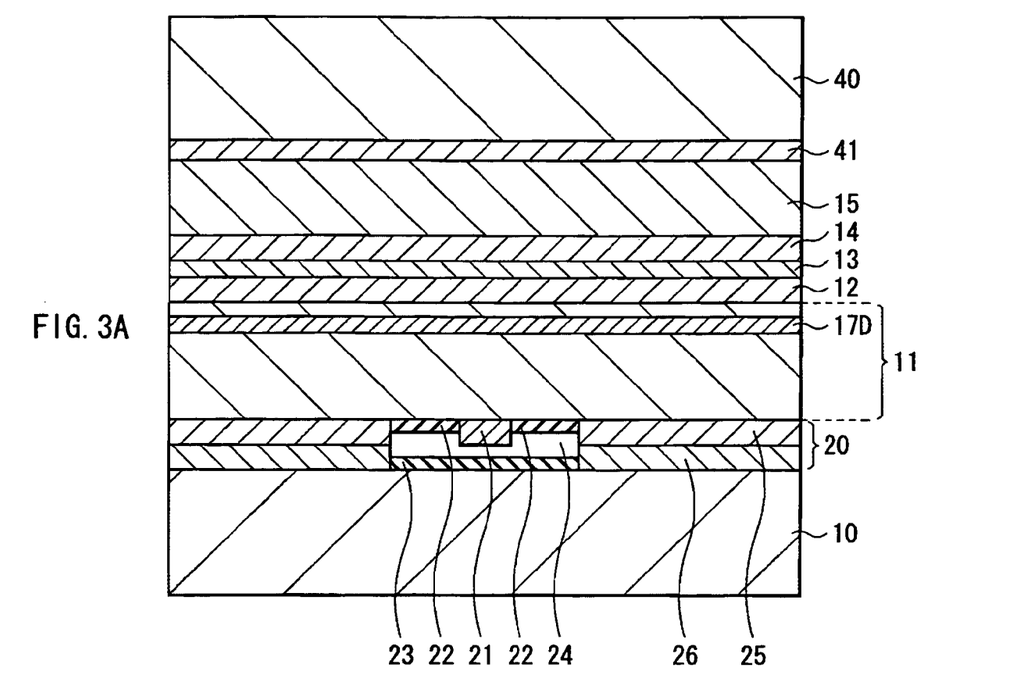
FIGS. 3A and 3B are cross sections for explaining a process subsequent to FIGS. 2A and 2B.
Figure 3B:
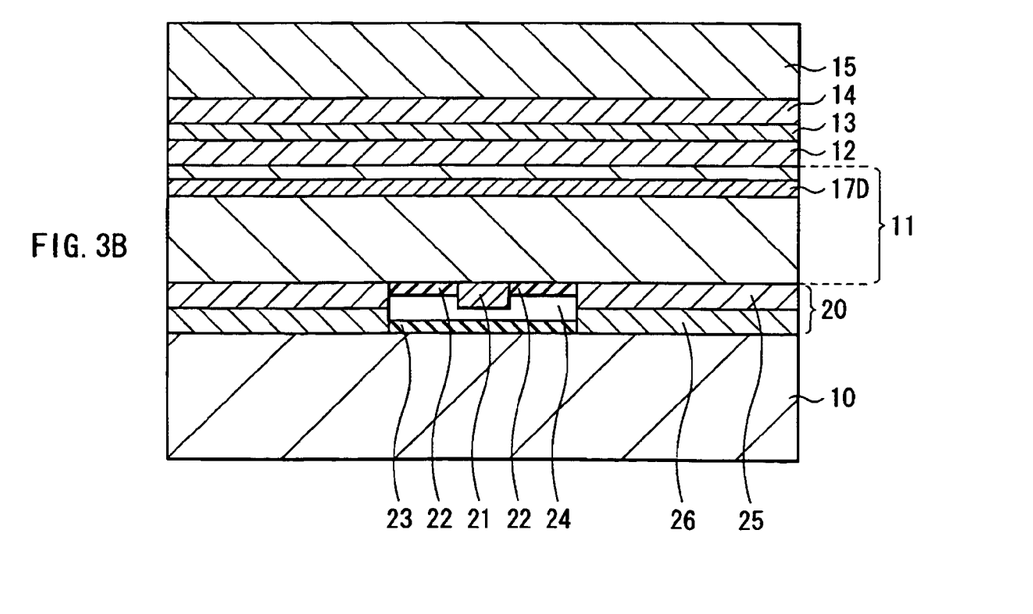

Next, the metal layers 25 and 26 are joined by being adhered to each other (refer to FIG. 3A). At this time, the gap 24 is formed between the high-reflectance layer 21 and the low-reflectance layer 22 and the low reflectance layer 23. Subsequently, the substrate 40 and the etching stop layer 41 are removed (refer to FIG. 3B). If necessary number of pairs of the upper DBR layers 15 is assured, the etching stop layer 41 may not be provided.

Figure 4A:
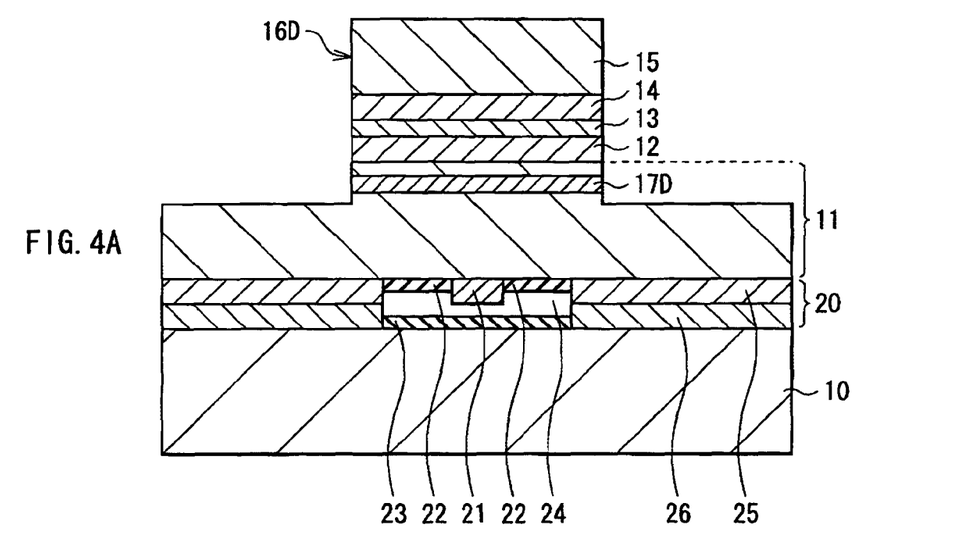
FIGS. 4A and 4B are cross sections for explaining a process subsequent to FIGS. 3A and 3B.
Figure 4B:
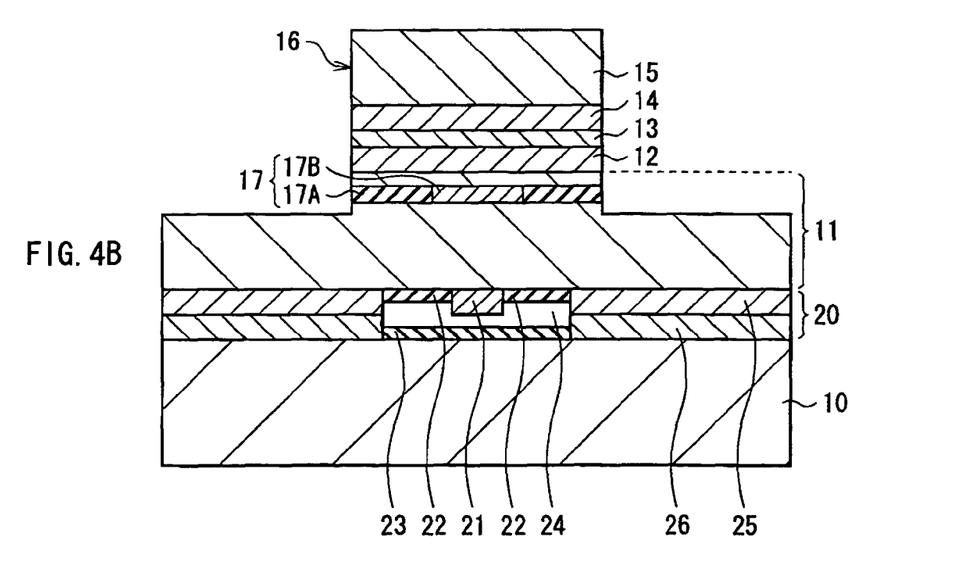

After that, for example, by reactive ion etching (RIE), the device is selectively etched from the upper DBR layer 15 side to form the mesa part 16D having a columnar shape and the layer 17D to be oxidized is exposed from the side face of the mesa part 16D (refer to FIG. 4A). In water-vapor atmosphere, oxidizing process is performed at high temperature to selectively oxidize Al in the layer 17D to be oxidized from the side face of the mesa part 16D. By the process, the outer edge region of the layer 17D to be oxidized becomes an insulating layer (aluminum oxide), and the current confinement layer 17 and the mesa part 16 are formed (refer to FIG. 4B).

For example, by CVD (Chemical Vapor Deposition), the above-described insulating material is deposited on the entire surface including the surface of the mesa part 16. After that, a part opposite to the top face of the mesa part 16 in the deposited insulating material is removed, and a protection film (not illustrated) is formed.

For example, by vacuum deposition, the above-described metal material is deposited on the entire surface. After that, for example, by selective etching, the upper electrode 18 having the aperture 18A in the center region in the top face of the mesa part 16 is formed (refer to FIG. 1). For example, by vacuum deposition, the lower electrode 19 is formed on the rear face of the substrate 10 (refer to FIG. 1). In such a manner, the laser diode 1 of the embodiment is manufactured.

The action and effect of the laser diode 1 of the embodiment will now be described.

In the laser diode 1 of the embodiment, when a predetermined voltage is applied across the upper and lower electrodes 18 and 19, current is injected to the active layer 13 via the current confinement region 17B in the current confinement layer 17, thereby generating light by recombination of electrons and holes. The light is reflected by the lower DBR layer 11 and the upper DBR layer 15, a laser oscillation occurs at a predetermined wavelength, and the light is emitted as a laser beam.

Figure 5:
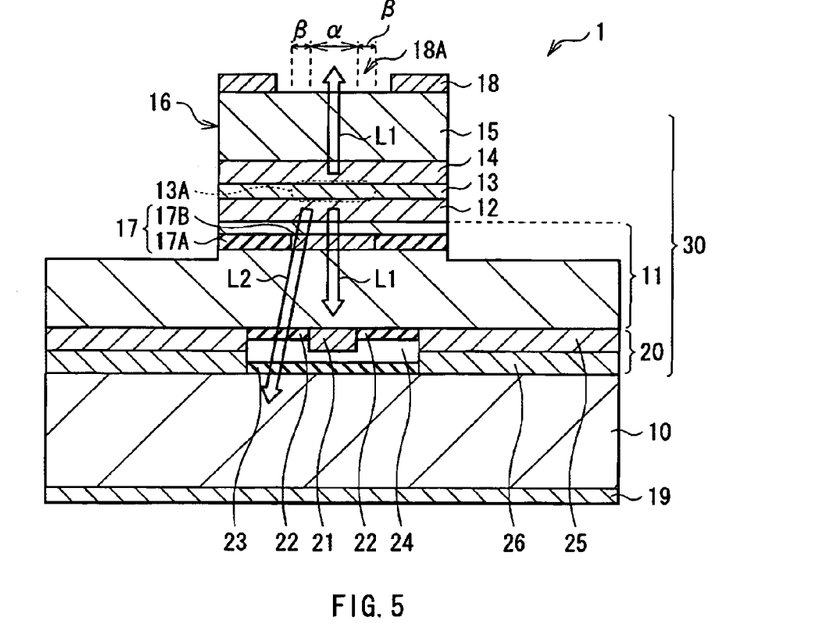
FIG. 5 is a cross section for explaining action of the laser diode of FIG. 1.

Generally, in a VCSEL, light output in the fundamental transverse mode is the largest in a center region a (refer to FIG. 5) in the light emission region 13A and tends to decrease with distance from the center region a of the light emission region 13A. Consequently, in the case of using the VCSEL for an application of high output, it is preferable to make the current injection region 17A and the light emission port (aperture 18A) large so that the laser beam in the fundamental transverse mode is taken as much as possible. However, generally, light output in the high-order transverse mode is the largest in an outer edge region β (refer to FIG. 5) apart from the center region α in the light emission region 13A only by predetermined distance and tends to decrease toward the center region a of the light emission region 13A. Consequently, if the current injection region 17A and the light emission port (aperture 18A) are made too large, there is the possibility that the laser beam in the high-order transverse mode is output with high output.

Figure 6:
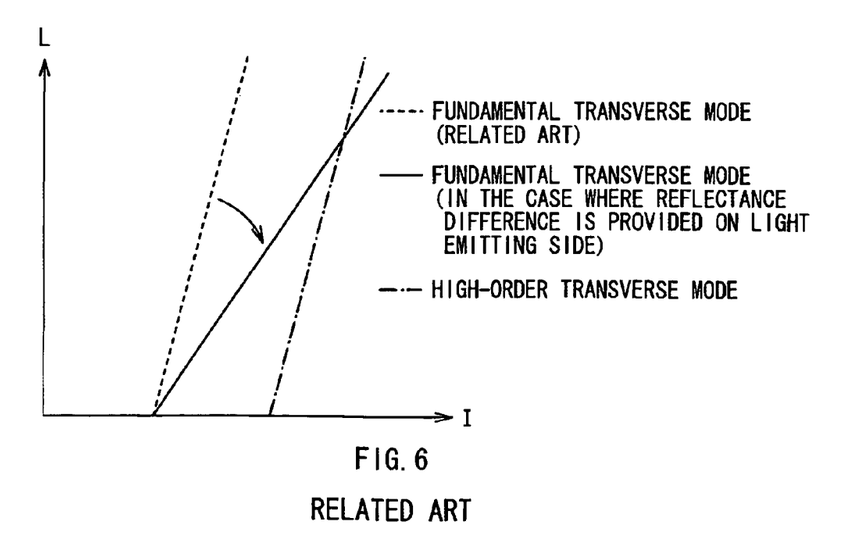
FIG. 6 is a characteristic diagram for explaining the I-L characteristic of a laser diode of related art.

Consequently, in the vertical cavity surface emitting layer of related art, by taking a countermeasure such as reduction in size of the current injection region 17A and the light emission port (aperture 18A) or providing of a structure having a complicated shape in the light emission port (aperture 18), emission of a laser beam in the high-order transverse mode is suppressed. Even in the case of using the VCSEL for an application of low output, to eliminate a laser beam in the high-order transverse mode as much as possible, a countermeasure similar to the above has to be taken. In the countermeasures, however, since variations are provided for the reflectance and the loss on the light emission side, it is difficult to satisfy both high gain and high output. For example, when reflectance is made high in the fundamental transverse mode, a gain increases in the fundamental transverse mode and a laser easily oscillates, but a light output in the fundamental transverse mode decreases. Consequently, for example, as illustrated in FIG. 6, the slope efficiency in the fundamental transverse mode drops from the broken line to the solid line which is worse than a slope efficiency in the high-order transverse mode (alternate long and short dash line in the diagram). Due to this, when an injection current amount is increased or temperature rises, a large amount of output of the high-order transverse mode is included in a light output of the laser diode, and there is a case that a beam profile is distorted.

Figure 7:
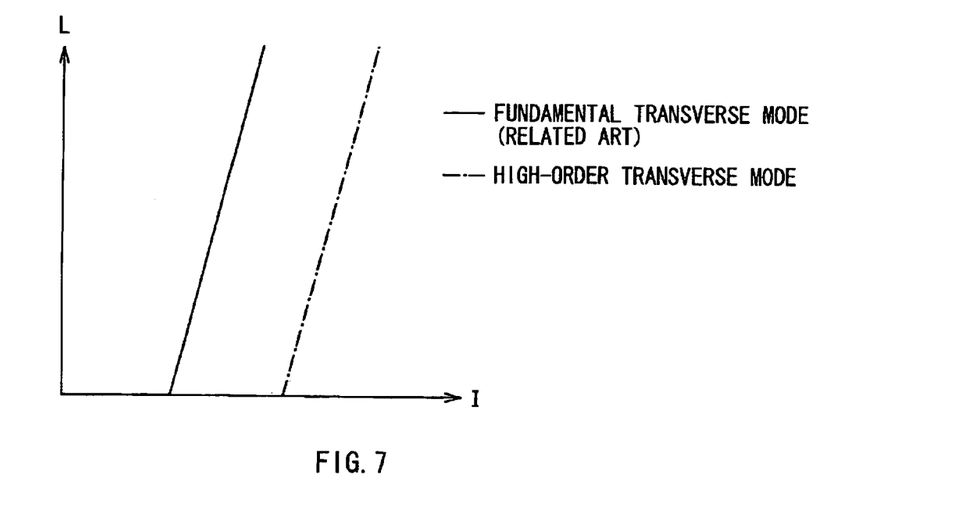
FIG. 7 is a characteristic diagram for explaining the I-L characteristic of the laser diode of FIG. 1.

On the other hand, in the embodiment, the transverse mode adjustment layer 20 is provided on the substrate 10 side, that is, on the side opposite to the light emitting side. In the transverse mode adjustment layer 20, reflectance at the oscillation wavelength λ in the region opposite to the center region a in the light emission region 13A becomes higher than that at the oscillation wavelength λ in the region opposite to the outer edge region β in the light emission region 13A. By the setting, light L1 in the fundamental transverse mode (refer to FIG. 5) is reflected at high reflectance by the high-reflectance layer 21 in the transverse mode adjustment layer 20 and is returned into a resonator. Therefore, in the fundamental transverse mode, the gain increases, and a laser easily oscillates. On the other hand, most of the light L2 (refer to FIG. 5) in the high-order transverse mode passes through the low-reflectance layer 22 in the transverse mode adjustment layer 20, the gap 24, and the low-reflectance layer 23 and leaks to the outside of the resonator. Therefore, in the high-order transverse mode, the gain decreases, and the laser does not oscillate easily. Further, since the transverse-mode adjustment layer 20 is provided on the side opposite to the light emitting side, there is no possibility that a light output in the fundamental transverse mode is disturbed by the transverse-mode adjustment layer 20. For example, as illustrated by the solid line in FIG. 7, the slope efficiency in the fundamental transverse mode may be maintained high. Consequently, even in the case where the injection current amount is increased or temperature rises, the high-order transverse mode is hardly included in the light output of the laser diode 1. As a result, a beam shape close to a perfect circle may be obtained. Therefore, a beam having a perfect circle shape may be output with high output power.

In the embodiment, in the case where at least the low-reflectance layers 22 and 23 provided in the region opposite to the outer edge of the light emission region 13A in the transverse-mode adjustment layer 20 function as non-reflecting layers and the substrate 10 is made of a material which absorbs light emitted from the active layer 13, there is no possibility that the light L2 in the high-order transverse mode is reflected by the low-reflectance layers 22 and 23 and the substrate 10 and becomes return light. Consequently, there is no fear that the I-L characteristic (particularly, threshold current) in the high-order transverse mode fluctuates due to the return light, and the beam profile fluctuates.

In the embodiment, fluctuations in the distances D1 and D2 do not exert any influence on light passing through the transverse-mode adjustment layer 20, so that it is unnecessary to strictly control thickness of each of the high-reflectance layer 21, the low-reflectance layers 22 and 23, the metal layers 25 and 26, and the gap 24. Therefore, at the time of manufacturing the high-reflectance layer 21 and the metal layers 25 and 26 or at the time of forming the transverse-mode adjustment layer 20 by adhesion, it is unnecessary to strictly control the layer thicknesses, adhesion pressure, and the like. It may be therefore said that the transverse-mode adjustment layer 20 has a structure of high mass productivity.

Although the present invention has been described by the embodiment, the present invention is not limited to the foregoing embodiment but may be variously modified.

Figure 8:
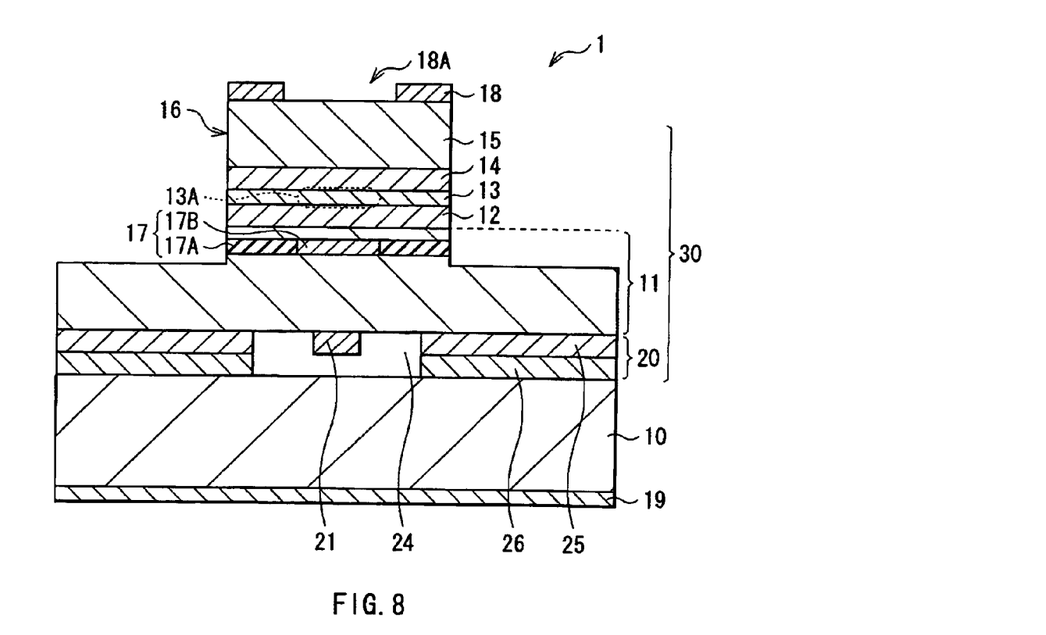
FIG. 8 is a cross section of a laser diode of a modification.
Figure 9:
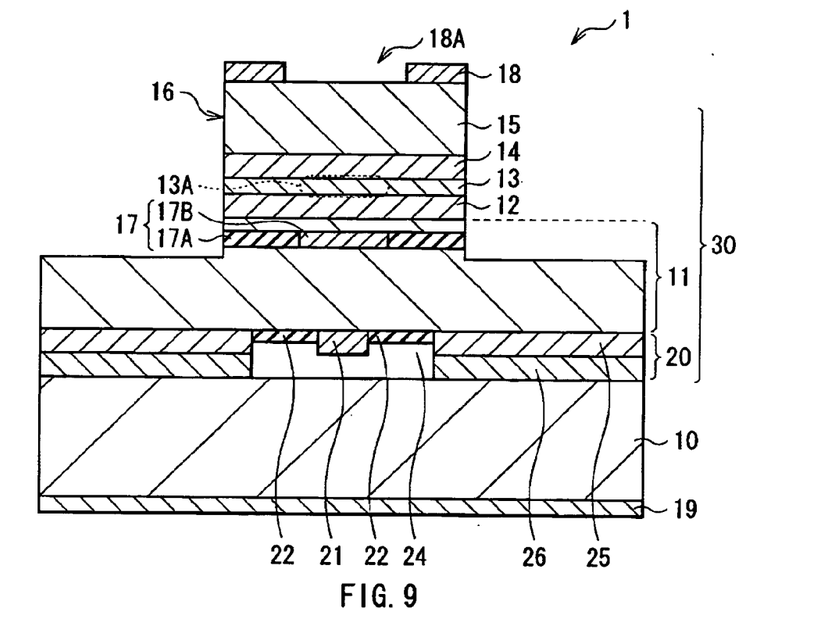
FIG. 9 is a cross section of a laser diode of another modification.
Figure 10:
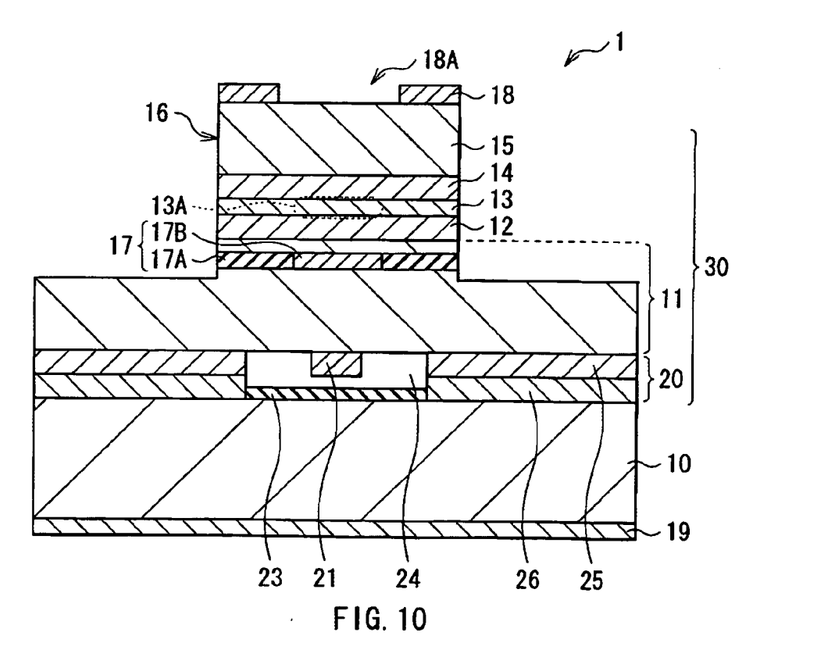
FIG. 10 is a cross section of a laser diode of further another modification.

For example, in the foregoing embodiment, the transverse-mode adjustment layer 20 has the low-reflectance layers 22 and 23. As necessary, they may not be provided. For example, as illustrated in FIG. 8, both of the low-reflectance layers 22 and 23 may not be provided. For example, as illustrated in FIG. 9, only the low-reflectance layer 23 may not be provided. For example, as illustrated in FIG. 10, only the low-reflectance layer 22 may not be provided.

For example, the conduction types described in the foregoing embodiment may be obviously changed to the opposite conduction types. Although the present invention has been described using the AlGaAs-based compound laser diode as an example in the foregoing embodiment, the present invention is also applicable to another compound laser diode such as, for example, a GaInP-based, AlGaInP-based, InGaAs-based, GaInP-based, InP-based, GaN-based, GaInN-based, or GaInNAs-based compound laser diode.

The present application contains subject matter related to that disclosed in Japanese Priority Patent Application JP 2008-215775 filed in the Japan Patent Office on Aug. 25, 2008, the entire content of which is hereby incorporated by reference.

Obviously many modifications and variations of the present invention are possible in the light of the above teachings. It is therefore to be understood that within the scope of the appended claims the invention may be practiced otherwise than as specifically described.

What is claimed is:

1. A vertical cavity surface emitting laser comprising a layer-stack structure including, on a substrate,
a transverse-mode adjustment layer,
a first multilayer reflecting mirror,
an active layer having a light emission region, and
a second multilayer reflecting mirror in order from the substrate side, and including
a current confinement layer in which a current injection region is formed in a region corresponding to the light emission region in the first multilayer reflecting mirror, between the first multilayer reflecting mirror and the active layer, between the active layer and the second multilayer reflecting mirror, or in the second multilayer reflecting mirror,
wherein in the transverse-mode adjustment layer, reflectance at an oscillation wavelength in a region opposite to a center of the light emission region is higher than that at an oscillation wavelength in the region opposite to an outer edge of the light emission region,
wherein the transverse-mode adjustment layer has a gap at least in a region opposite to the light emission region, and
wherein the transverse-mode adjustment layer has a first metal layer which is in contact with the substrate and a second metal layer which is in contact with the first multilayer reflecting mirror in a region which does not face the light emission region, and
the first and second metal layers are joined to each other by adhesion.

2. A vertical cavity surface emitting laser comprising:
an active layer between a first multilayer reflecting mirror and a second multilayer reflecting mirror, the active layer having a light emission region;
a metal layer between the first multilayer reflecting mirror and a substrate, the metal layer having an aperture in a region opposite to the light emission region; and
a transverse-mode adjustment region is formed in the aperture, the transverse-mode adjustment region including a first reflectance layer in a region opposite to a center portion of the light emission region and a second reflectance layer in a region opposite to an outer portion of the light emission region,
wherein, at an oscillation wavelength, a reflectance of the first reflectance layer is greater than a reflectance of the second reflectance layer.

3. The vertical cavity surface emitting laser according to claim 2, wherein
a first gap is formed between the first reflectance layer and the substrate, and
a second gap is formed between the second reflectance layer and the substrate.

4. The vertical cavity surface emitting laser according to claim 3, wherein a thickness of the first gap in a direction perpendicular to the substrate is less than a thickness of the second gap in the direction perpendicular to the substrate.

5. The vertical cavity surface emitting laser according to claim 2, wherein the transverse-mode adjustment region further includes a third reflectance layer formed in the aperture, the third reflectance layer being formed at least in a region opposite to the outer portion of the light emission region, a reflectance of the third reflectance layer at the oscillation wavelength, being less than the reflectance of the first reflectance layer.

6. The vertical cavity surface emitting laser according to claim 5, wherein the third reflectance layer is formed in a region opposite to the first reflectance layer and the second reflectance layer.

7. The vertical cavity surface emitting laser according to claim 2, wherein the first reflectance layer is in contact with a surface of the first multilayer reflecting layer.

8. The vertical cavity surface emitting laser according to claim 2, wherein the second reflectance layer is in contact with a surface of the first multilayer reflecting layer.

9. The vertical cavity surface emitting laser according to claim 6, wherein the third reflectance layer is in contact with a surface of the substrate.

10. The vertical cavity surface emitting laser according to claim 6, wherein a first gap is formed between the first reflectance layer and the third reflectance layer, a second gap is formed between the second reflectance layer and the third reflectance layer, and a thickness of the first gap in a direction perpendicular to the substrate is less than a thickness of the second gap in the direction perpendicular to the substrate.

* * * * *